(12) United States Patent
Durller

(10) Patent No.: US 9,991,091 B1
(45) Date of Patent: Jun. 5, 2018

(54) OPTICAL COLUMN FOR FOCUSED ION BEAM WORKSTATION

(71) Applicant: BATELLE MEMORIAL INSTITUTE, Columbus, OH (US)

(72) Inventor: Michael G. Durller, London, OH (US)

(73) Assignee: BATTELLE MEMORIAL INSTITUTE, Columbus, OH (US)

( * ) Notice: Subject to any disclaimer, the term of this patent is extended or adjusted under 35 U.S.C. 154(b) by 33 days.

(21) Appl. No.: 15/200,499

(22) Filed: Jul. 1, 2016

Related U.S. Application Data

(60) Provisional application No. 62/188,203, filed on Jul. 2, 2015.

(51) Int. Cl.
*H01J 37/22* (2006.01)
*G02B 21/00* (2006.01)
*G02B 21/02* (2006.01)
*H01J 37/18* (2006.01)

(52) U.S. Cl.
CPC ........ *H01J 37/226* (2013.01); *G02B 21/0016* (2013.01); *G02B 21/02* (2013.01); *H01J 37/18* (2013.01)

(58) Field of Classification Search
USPC ........ 359/511, 513, 383, 385, 661, 666, 668
See application file for complete search history.

(56) References Cited

U.S. PATENT DOCUMENTS

| | | | |
|---|---|---|---|
| 3,584,779 A * | 6/1971 | Kessler | G06K 7/10881 235/437 |
| 5,821,549 A | 10/1998 | Talbot et al. | |
| 7,245,476 B2 | 7/2007 | Komoriya et al. | |
| 7,297,948 B2 | 11/2007 | Benas-Sayag et al. | |
| 2003/0043357 A1* | 3/2003 | Shimoda | G03F 7/707 355/53 |
| 2012/0134017 A1* | 5/2012 | Ganser | G02B 21/241 359/383 |

* cited by examiner

*Primary Examiner* — Kiet T Nguyen
(74) *Attorney, Agent, or Firm* — Richard M. Klein; Fay Sharpe LLP

(57) ABSTRACT

An in-situ optical column comprises: a hollow objective tube; a microscope objective including an outermost lens, the microscope objective inserted at least partway into an objective end of the hollow objective tube with the outermost lens exposed; and a vacuum-tight seal spanning the inside of the hollow objective tube. An ocular lens or digital imaging unit may be disposed at a camera end of the hollow objective tube opposite from the objective end of the hollow objective tube to form an in-situ microscope. The in-situ optical column may include a mounting flange by which the column is mounted to a flange of a vacuum feedthrough of a vacuum system, with the outermost lens of the microscope objective exposed to vacuum of the vacuum chamber and the microscope objective arranged to image a sample disposed on the sample stage of the vacuum system.

20 Claims, 5 Drawing Sheets

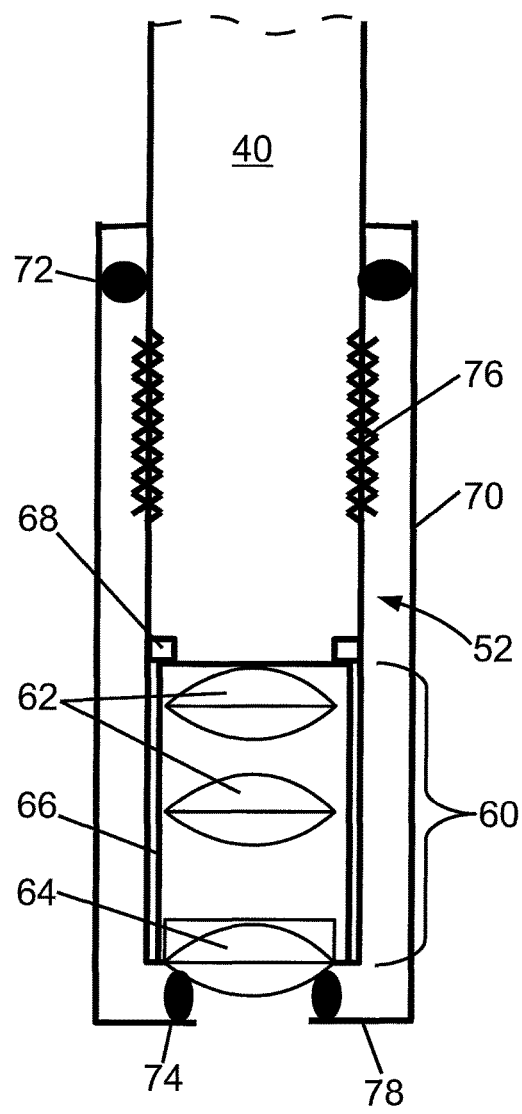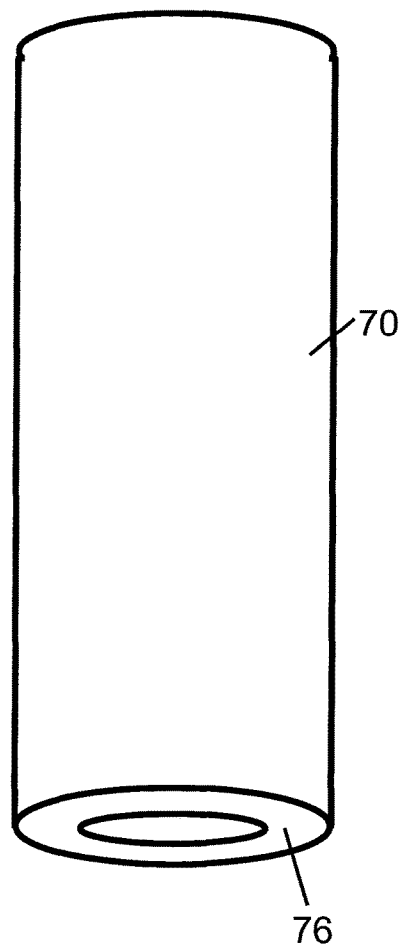
Fig. 3
Fig. 4

OPTICAL COLUMN FOR FOCUSED ION BEAM WORKSTATION

This application claims the benefit of U.S. Provisional Application No. 62/188,203 filed Jul. 2, 2015 and titled "OPTICAL COLUMN FOR FOCUSED ION BEAM WORKSTATION". U.S. Provisional Application No. 62/188,203 filed Jul. 2, 2015 and titled "OPTICAL COLUMN FOR FOCUSED ION BEAM WORKSTATION" is incorporated herein by reference in its entirety.

BACKGROUND

The following relates to the optical microscopy arts, vacuum processing arts, focused ion beam (FIB) workstation arts, and related arts.

A focused ion beam (FIB) workstation provides a vacuum environment for performing inspection and/or processing of semiconductor integrated circuit (IC) devices, photonic devices, radio frequency (RF) circuits, microscopic biological samples, and other samples at micron or nanometer scales. A typical FIB workstation includes a vacuum chamber with tools such as one or more focused ion beam sources, one or more electron beam sources, and so forth, and may be used for tasks such as circuit tuning, failure analysis, and so forth. The vacuum chamber of a FIB workstation is typically evacuated to a base pressure on the order of about $5\times10^{-6}$ mbar ($3.7\times10^{-6}$ torr) or lower in order to support focused ion beam and/or electron beam operations. Focused ion or electron beams can be used for tasks such as sputtering, milling, or so forth, sometimes in conjunction with a controlled flow of working gas through the vacuum chamber.

BRIEF SUMMARY

In some illustrative embodiments disclosed herein, an in-situ optical column comprises: a hollow objective tube; a microscope objective including an outermost lens, the microscope objective inserted at least partway into an objective end of the hollow objective tube with the outermost lens exposed; and a vacuum-tight seal spanning the inside of the hollow objective tube. In some embodiments an annular rim or lip extends inward over a periphery of the exposed outermost lens of the microscope objective, and an annular gasket seals between and contacts the periphery of the outermost lens of the microscope objective and the annular rim or lip. In these embodiments, the vacuum-tight seal is defined by the annular rim or lip, the annular gasket, and the outermost lens of the microscope objective. In some such embodiments the annular rim or lip is integral with or connected with the objective tube and extends inward.

In some illustrative embodiments disclosed herein, an in-situ optical column comprises: a hollow objective tube; a microscope objective including an outermost lens, the microscope objective inserted at least partway into an objective end of the hollow objective tube with the outermost lens exposed; and a vacuum-tight seal spanning the inside of the hollow objective tube. In some embodiments an annular rim or lip has a vacuum tight seal with the objective end of the hollow objective tube and extends inward, and an annular gasket seals between and contacts a periphery of the outermost lens of the microscope objective and the annular rim or lip. In these embodiments, the vacuum-tight seal is defined by the annular rim or lip, the annular gasket, and the outermost lens of the microscope objective. In some such embodiments the annular rim or lip is integral with or connected with the objective tube and extends inward.

In some illustrative embodiments disclosed herein, an in-situ optical column of any one of the immediately preceding two paragraphs further includes an objective sleeve disposed over and sealed with an outside of the objective end of the hollow objective tube, the annular rim or lip integral with or connected with the objective sleeve and extending inward. The vacuum-tight seal in these embodiments is further defined by the objective sleeve.

In some illustrative embodiments disclosed herein, an in-situ optical column comprises: a hollow objective tube; a microscope objective including an outermost lens, the microscope objective inserted at least partway into an objective end of the hollow objective tube with the outermost lens exposed; and a vacuum-tight seal spanning the inside of the hollow objective tube, the vacuum-tight seal comprising a transparent window disposed on the side of the microscope objective opposite from the outermost lens, the periphery of the transparent window being sealed to the inside surface of the hollow objective tube. In some such embodiments the microscope objective has outgassing holes formed into a housing of the microscope objective.

In some illustrative embodiments disclosed herein, an in-situ optical column is provided as set forth in any one of the immediately preceding four paragraphs, in which the microscope objective is not a vacuum-tight assembly. In some illustrative embodiments disclosed herein, an in-situ optical column is provided as set forth in any one of the immediately preceding four paragraphs, in which the outermost lens of the microscope objective is an achromatic lens or an apochromatic lens. In some illustrative embodiments disclosed herein, an in-situ optical column is provided as set forth in any one of the immediately preceding four paragraphs, in which the microscope objective has a magnification of at least 10×. In some illustrative embodiments disclosed herein, an in-situ optical column is provided as set forth in any one of the immediately preceding four paragraphs, in which the microscope objective has a magnification of between 40× and 50× inclusive. In some illustrative embodiments disclosed herein, an in-situ optical column is provided as set forth in any one of the immediately preceding four paragraphs, further comprising: a mounting flange configured to connect with a flange of a vacuum feedthrough, the mounting flange having a sealed central through hole passing the objective tube; and a tube clamp secured with the mounting flange and clamped to the objective tube.

In some illustrative embodiments disclosed herein, an in-situ microscope is disclosed, comprising an in-situ optical column as set forth in any one of the immediately preceding five paragraphs and an ocular lens or digital imaging unit disposed at a camera end of the hollow objective tube opposite from the objective end of the hollow objective tube. In some illustrative embodiments disclosed herein, a vacuum system comprises: a vacuum chamber having a vacuum feedthrough with a flange; a sample stage; and an in situ optical column as set forth in any one of the immediately preceding five paragraphs and further including a mounting flange via which the in situ optical column is mounted to the flange of the vacuum feedthrough with the outermost lens of the microscope objective exposed to vacuum of the vacuum chamber and the microscope objective arranged to image a sample disposed on the sample stage. The vacuum system may in some embodiments be a focused ion beam (FOB) workstation further comprising at least one focused ion beam tool arranged to apply a focused ion beam to a sample disposed on the sample stage.

In some illustrative embodiments disclosed herein, an in-situ optical column comprises a microscope objective with an outermost lens and an annular gasket sealing against the outermost lens.

BRIEF DESCRIPTION OF THE DRAWINGS

FIG. 3 diagrammatically illustrates an enlarged view of the objective end of the objective tube of the in-situ microscope of FIGS. 1 and 2 including the microscope objective and related components.

FIG. 4 diagrammatically illustrates a perspective view of the objective sleeve of the in-situ microscope of FIGS. 1 and 2.

DETAILED DESCRIPTION

Figure 1:
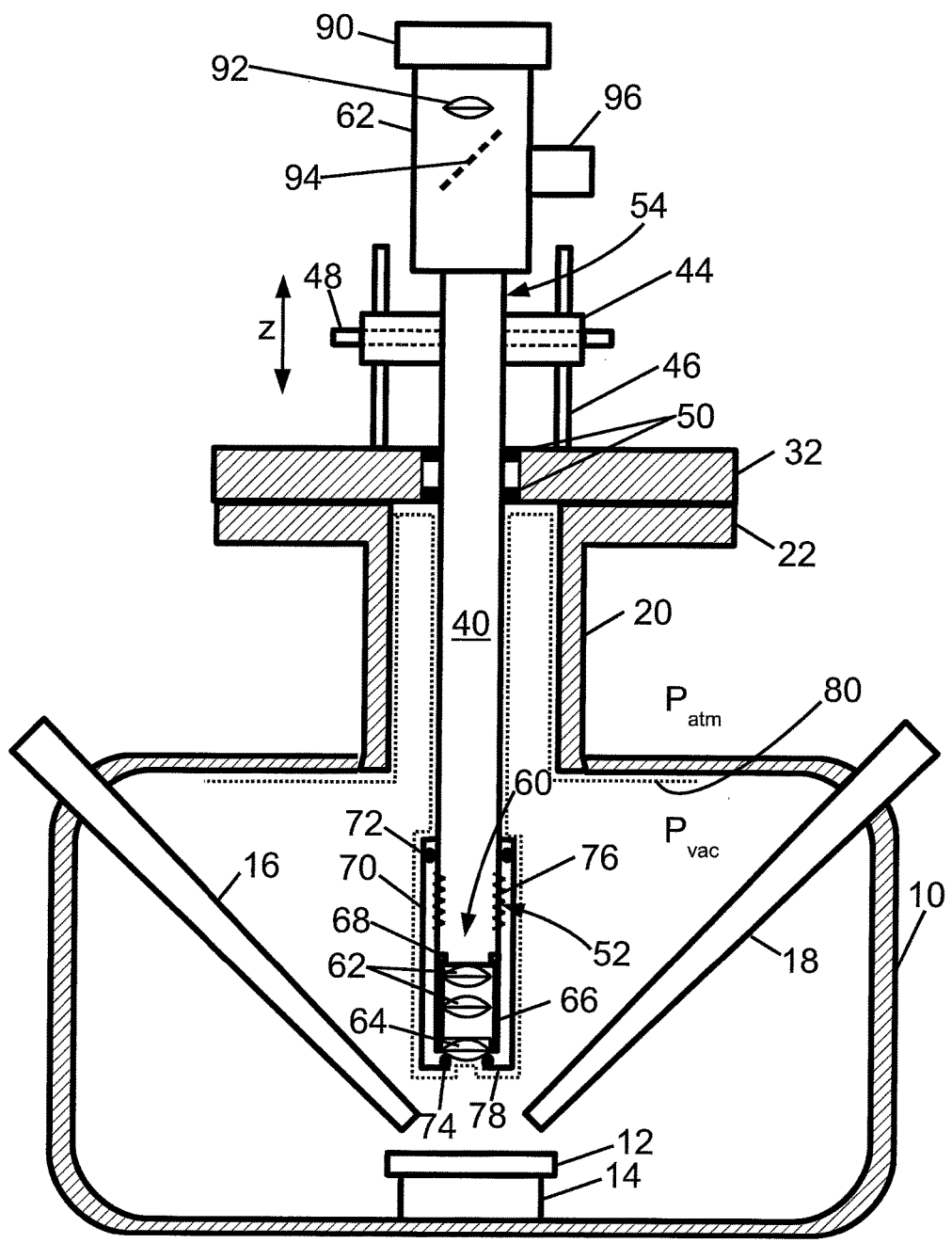
FIG. 1 diagrammatically illustrates a focused ion beam (FIB) workstation in sectional view, including an in-situ optical microscope as disclosed herein.

In the context of a focused ion beam (FIB) workstation, it can be advantageous to provide an optical microscope, operating in the visible or near-infrared (NIR) wavelength range, via which the FIB workstation operator can view the integrated circuit (IC) or other sample undergoing inspection and/or processing. For tasks performed at the micron or nanometer scale, such a microscope should preferably provide a magnification on the order of 200× to 500λ, and should also have a high numerical aperture (NA) and low chromatic aberration. To obtain optical magnification of 200× or higher for the microscope, the objective should have 40× to 50× magnification or higher. This combination of high optical magnification, low chromatic aberration, and high NA generally requires that the microscope objective be located close to the object being viewed. Microscope objectives with the requisite magnification, large working distance, low chromatic aberration, and high NA are available commercially, usually in the form of a set of one or more compound lenses mounted in a cylindrical tube. To reduce chromatic aberration, the lenses of the objective are compound achromatic or apochromatic lenses. (An achromatic lens is designed to bring two design-basis wavelengths into focus in the same plane; an apochromatic lens is designed to bring three design-basis wavelengths into focus in the same plane.)

However, off-the-shelf microscope objectives providing the requisite magnification, large working distance, low chromatic aberration, and high NA are usually not constructed to be vacuum-tight. Rather, in a typical microscope setup the objectives are designed to be threaded into sockets of a revolving microscope nosepiece, and the microscope user rotates the nosepiece to place a chosen objective into position to view an object on the microscope stage. Such optical microscope nosepiece sockets typically are RMS standard or M26×0.7 mm thread size. In such typical applications, there is no need for the objectives to be vacuum-tight. While a microscope objective could in principle be sealed with transparent glass covers placed over the ends of the tubular housing, such glass covers would adversely impact optical performance by introducing reflections and absorption, significantly reducing effective NA and adding optical spherical aberration.

Moreover, for visual inspection of an IC or other device under processing in a FIB workstation, it is useful to be able to move the objective toward or away from the IC to adjust focus and accommodate difference IC thicknesses (usually called z-direction adjustment) and to adjust tilt to accommodate various IC orientations. Manipulating a microscope objective thusly while inside the vacuum chamber presents further challenges. In view of such difficulties, versatile in-situ optical microscopy is not a feature commonly provided in FIB workstations.

Disclosed herein are in-situ optical microscopes for use in a vacuum chamber, in which a surface of the (outermost lens of the typically compound) objective lens is directly exposed to vacuum. By such an arrangement, reduced spherical aberration and higher working distance is achieved. The term "in-situ" in this context refers to a microscope having its objective lens exposed to the vacuum. In illustrative applications, the in-situ microscope is deployed in conjunction with an FIB workstation, but it will be appreciated that the disclosed in-situ microscopes may be employed in substantially any application pertaining to the inspection and/or processing of a sample (e.g. electronic device, material sample, biological sample, or so forth) in a vacuum environment. By way of illustration, the disclosed in-situ microscopes may be deployed in conjunction with electron microscopy systems (e.g. SEM or TEM), surface analysis systems (e.g. Auger electron spectroscopy, secondary ion mass spectroscopy i.e. SIMS, x-ray photoelectron spectroscopy i.e. XPS), and so forth.

The disclosed in-situ microscopes are also suitable for use in vacuum deposition systems (e.g. sputtering, thermal evaporation, molecular beam epitaxy) so long as provisions can be made to prevent or remove coating of the exposed objective lens during the deposition processing. This can be done, for example, by using the tilt mechanism provided with some embodiments of the disclosed in-situ microscopes to tilt the objective lens away from a (line-of-sight) deposition beam, and/or using a mechanical shutter, and/or by heating the objective lens in the vacuum using a wrapped heater tape or the like to remove deposits. If the vacuum chamber is opened on a routine basis, e.g. to load/unload samples, then the objective lens can be cleaned during the chamber opening.

It is also contemplated to employ the disclosed in-situ microscope in conjunction with pressurized inspection or process chambers (that is, chambers brought to an elevated pressure that is higher than atmospheric pressure), so long as the vacuum seals (e.g. o-rings or crushed gaskets) of the in-situ microscope are designed to maintain integrity at the elevated operational pressure.

With reference to FIG. 1, an illustrative in-situ microscope is described deployed in an illustrative focused ion beam (FIB) workstation environment. The FIB workstation includes a vacuum chamber 10 containing a sample 12 for inspection or processing mounted on a sample stage 14, and one or more inspection or processing tools 16, 18 arranged to inspect or manipulate/process the sample 12. The sample stage 14 is shown diagrammatically, and may have various mechanisms for manipulating the sample 12 such as a sample heater, rotary stage, or so forth. Likewise, the inspection or processing tools 16, 18 are shown diagrammatically and may comprise tools such as focused ion beam guns, electron guns, gas injectors, or so forth. The FIB workstation further includes one or more vacuum pumps (not shown) which may be of any suitable type, e.g. a turbomolecular pump backed by a mechanical roughing pump (that is, the roughing pump is usually used in a first stage of evacuation), diffusion pumps, cryogenic pumps, ion pumps, or so forth. The FIB workstation also includes a mechanism for loading and unloading the sample 12, either by venting the chamber 10 to atmosphere and opening an access port or by way of an ancillary load lock chamber with a gate valve (features not shown). The vacuum chamber 10 is evacuated by the vacuum pump(s) to a base pressure ($P_{vac}$) that is typically on the order of $5 \times 10^{-6}$ mbar ($3.7 \times 10^{-6}$ torr) or lower in order to support focused ion beam and/or electron beam operations. The vacuum chamber 10 is typically in atmosphere, i.e. the external pressure is atmospheric pressure ($P_{atm}$).

Figure 2:
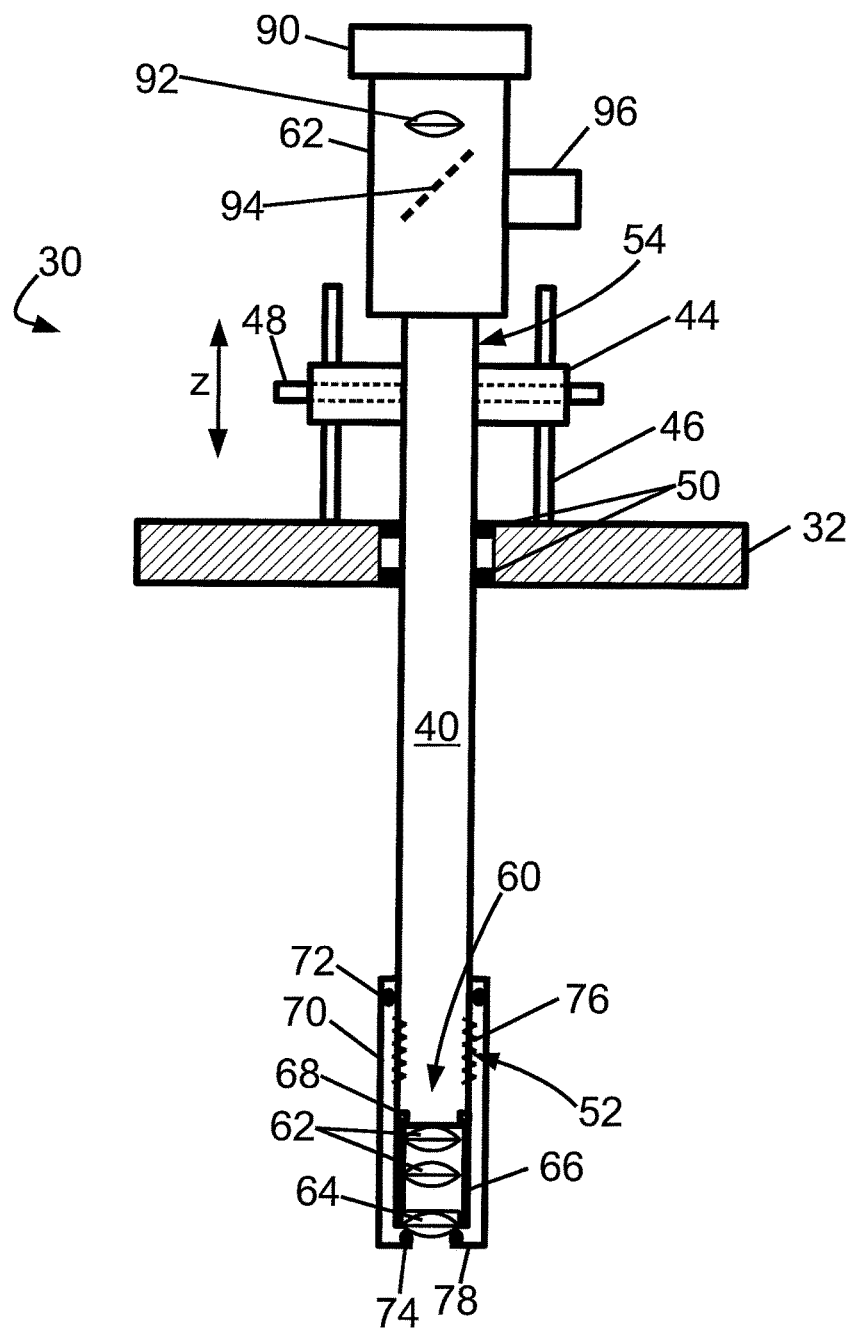
FIG. 2 diagrammatically illustrates the in-situ optical microscope of FIG. 1 in isolation.

With continuing reference to FIG. 1 and with further reference to FIGS. 2-4, an illustrative in-situ microscope 30 (labeled only in FIG. 2) is mounted on a vacuum feedthrough 20 of the vacuum chamber 10 terminating in a flange 22. The illustrative vacuum feedthrough 20 is located directly "above" or "in front" of the sample 10 which is advantageous for providing a direct view of the sample 10; however, an oblique orientation respective to the sample is also contemplated, and for example may be necessitated if one of the FIB workstation tools requires normal incidence access to the sample. The illustrative in-situ microscope 30 is shown mounted on the feedthrough 20, 22 in FIG. 1, and is shown in isolation in FIG. 2 with detail drawings of selected components in FIGS. 3 and 4. The in-situ microscope 30 includes a mounting flange 32 sized and shaped to mate with the flange 22 of the vacuum chamber feedthrough 20. A vacuum-tight seal at the mating between the flanges 22, 32 is provided by any suitable sealing configuration, such as an interposed o-ring, an interposed crushable metal gasket, an interposed copper gasket in combination with knife-edge flanges to provide ultra-high vacuum (UHV)-tight sealing, or so forth. The mounting flange 32 provides mechanical support for an objective tube 40 via a tube mount mechanism that includes a tube clamp 44 holding the objective tube 40 and secured to the flange 32 by standoffs 46. The standoffs 46 may, for example, be metal rods secured to the flange 32 by threaded ends engaged with threaded blind holes drilled into the flange 32 (that is, drilled into the side of the flange 32 distal from the mating flange 22). In some embodiments, these mounting components 44, 46 are non-adjustable; however, in the illustrative embodiment, the tube clamp 44 is adjustably positioned to the standoffs 46 in an indicated "z"-direction, while tilt adjustment screws 48 enable limited tilting of the in-situ microscope. To accommodate translation in the z-direction and tilting of the microscope while maintaining a vacuum-tight seal, the objective tube 40 passes through a central through-hole of the mounting flange 32 with this pass-through sealed by one or more (illustrative two) o-rings 50. The pivot point for tilting of the objective tube 40 is thus at this through-hole passing through the flange 32. Other mechanical configurations are contemplated to provide mechanical tilt and/or z-directional adjustment of the objective tube 40, such as employing a fixed z-directional position of the clamp with the clamp being able to be opened to slide the objective tube in the z-direction to achieve z-positional adjustment followed by re-engaging the clamp.

The objective tube 40 is a hollow cylindrical tube, preferably of aluminum, stainless steel, or another metal although other materials such as plastic are contemplated. The objective tube 40 has an objective end 52 disposed inside the vacuum chamber 10 (hence, also called the vacuum end 52) and a camera end 54 disposed outside the vacuum chamber 10 (hence, also called the pressure end or external end 54). A microscope objective 60 (sometimes referred to herein as an "objective" 60 as is common in the microscopy arts) is mounted at the objective end 52 of the objective tube 40, while an illumination/imaging unit 62 is mounted at the external end 54.

With continuing reference to FIGS. 1 and 2 and with further reference to the detail drawings of FIGS. 3 and 4, the objective end 52 of the hollow objective tube 40 receives the microscope objective 60. Advantageously, the objective 60 may be an "off-the-shelf" commercially available compound lens-based objective comprising a set of one or more (usually compound) lenses 62, 64 mounted in a cylindrical tube 66 designed to be threaded into a socket of the revolving nosepiece of a conventional microscope. (However, it is alternatively contemplated to employ a custom-built objective, optionally having its tubular housing embodied by the objective end 52 of the hollow objective tube 40 so that separate objective tubular housing 66 is omitted). The objective tubular housing 66 is arranged coaxially at least partially inside the objective end of the hollow objective tube 40 with the tube axis of the objective tubular housing 66 coinciding with the tube axis of the hollow objective tube 40. The objective 60 preferably has magnification of 10× to 100× (although higher or lower magnification is contemplated) and in some embodiments has magnification in the range 40× to 50×. The objective 60 preferably has low chromatic aberration, achieved through the use of lenses 62, 64 which are preferably achromatic lenses or even more preferably apochromatic lenses. The objective 60 further preferably has high numerical aperture (NA), e.g. NA close to unity (NA~1). The objective 60 particularly has an outermost lens 64 which is near or at one end of the tubular objective housing 66 and is exposed to the vacuum (pressure $P_{vac}$) of the evacuated vacuum chamber 10. The objective 60 may be mounted inside the inner diameter of the hollow objective tube 40 in various ways. In one approach, the threading of a conventional commercial objective (ordinarily used to screw the objective into the microscope nosepiece) is leveraged by providing mating threading on the inner diameter of the objective end 52 of the hollow objective tube 40 (approach not illustrated). In another approach, the tubular housing of the objective 60 slides into the objective end 52 of the hollow objective tube 40 until it seats against an inner annular ledge or rim 68 formed on the inner diameter wall of the objective end 52 of the hollow objective tube 40. In this case, the outer diameter of the objective 60 and the inner diameter of the objective tube 40 (at least at the objective end 52) are sized to provide a snug but sliding fit (possibly with some or even substantial frictional resistance) of the objective 60 inside the objective tube 40. The ledge or rim 68 may also be provided in combination with a threaded connection of the objective 60 inside the objective end 52 of the objective tube 40. It should also be noted that while in the illustrative example the objective 60 is entirely inside the objective end 52 of the objective tube 40, in other embodiments the lower end of the objective 60 may protrude some distance outside of the objective tube 40.

A challenging problem is to prevent vacuum leakage through the objective 60 into the hollow objective tube 40. If the objective 60 is a vacuum-tight assembly then this can be avoided by providing one or more o-rings or other seals between the outer diameter of the tubular objective housing 66 and the inner diameter of the hollow objective tube 40. However, most commercially available objectives are not vacuum-tight assemblies since they are designed to fit onto the nosepiece of a microscope in an air ambient. A possible solution is to add a vacuum-tight seal at the terminus of the objective end 52 of the objective tube 40. However, this would require setting the objective 60 further into the objective end 52 of the objective tube 40, which would reduce the effective NA, and could introduce reflections, absorption, or optical spherical aberration. It would also complicate manufacturing as the objective would either need to be loaded through the camera end 54 of the objective tube and passed entirely through the tube, or the objective end 52 would need to be sealed off with the window after loading the objective into the objective tube.

As further seen in FIGS. 1 and 2 and especially in FIG. 3, in one illustrative embodiment a vacuum-tight seal of the objective 60 to the objective end 52 of the hollow objective tube 40 is provided by an objective sleeve 70 and upper and lower o-rings 72, 74. The objective sleeve 70 fits over the outside of the objective end 52 of the objective tube 40, in the illustrative embodiment being secured onto the objective end 52 of the objective tube 40 by a threaded connection 76. The first o-ring 72 is disposed at the upper end of the objective sleeve 70 between the outer diameter of the objective end 52 and the inner diameter of the objective sleeve 60. This first o-ring 72 seals the gap between the upper end of the objective sleeve 70 and the objective end 52 of the objective tube 40. If the threaded connection 76 forms a vacuum-tight seal, then the upper o-ring 72 may optionally be omitted. It is also contemplated to employ another type of seal between the upper end of the objective sleeve 70 and the objective tube 40, such as a welded, brazed, or other seal.

The illustrative embodiment of FIGS. 1-3 is premised on the recognition herein that, although the objective 60 as an assembly is usually not vacuum-tight, the outermost lens 64 of the objective 60 is impermeable to gases (or at least sufficiently so to not present a vacuum leak). Thus, a seal can be made to that outermost lens 64 of the objective 60 in order to provide the requisite vacuum seal. To this end, the objective sleeve 70 has a lower annular rim or lip 78 that extends over (i.e. overlaps) the outer periphery of the outermost lens 64, and the lower o-ring 74 seals the annular gap between the annular rim or lip 78 of the objective sleeve 70 and the outermost lens 64 of the objective 60. That is, the lower o-ring 74 contacts the outermost lens 64 and the annular rim or lip 78. The lower o-ring 74 either does not contact the tubular objective housing 66 at all, or contacts the tubular objective housing 66 in addition to contacting the outermost lens 64 (with the contact to the tubular objective housing 66 being incidental and not relied upon to provide the vacuum-tight seal).

One possible concern with this arrangement is that the objective 60 is designed to operate in an air ambient, but in this design is actually disposed in vacuum (pressure $P_{vac}$). However, this is not an issue in practice, because the refractive index of (perfect) vacuum is $n_{vac}=1$ by definition; while, the refractive index of air is $n_{air}=1.000$ to three decimal places. In other words, $n_{vac}=n_{air}$ to three decimal places.

The sleeve lip 78 and the lower o-ring 74 squeezed against the outermost objective lens 74 does reduce the NA insofar as it occludes the outermost portion of the light collection aperture of the objective 60. However, the approach still allows a large unobstructed portion of the working area of the outermost objective lens 74 to collect light from the sample 12. Moreover, if the objective 60 is designed to not utilize this occluded outermost perimeter of the outermost objective lens 74 (which may be the case in some designs to reduce spherical aberration of the objective 60) then no loss in NA is introduced by the sleeve lip 78 and lower o-ring 74.

With particular reference now to FIG. 1, the combination of the vacuum-tight seal between the two flanges 22, 32, the seal provided by the o-rings 50 at the central through-hole of the mounting flange 32, the seal of the upper end of the objective sleeve 70 provided by the upper o-ring 72, and the seal at the lower end of the objective sleeve 70 provided by the o-ring 74 sealing the gap between the sleeve ledge or lip 78 and the outermost lens 64 collectively define a vacuum boundary 80 indicated in FIG. 1 by a dashed line. It may be noted that any of the o-rings may be replaced by a dual (or triple, etc) set of o-rings for redundancy and/or to provide a better seal (although this is preferably not the case for the o-ring 74 sealing against the outermost lens 64 since an additional o-ring at this location would further reduce NA). It will also be appreciated that the illustrative o-rings can be replaced by other types of annular gaskets, such as other types of elastomeric gaskets, crushed metal gaskets (e.g. copper gaskets), or so forth. In some embodiments, the o-rings 50 sealing the central through-hole of the mounting flange 32 are replaced by a bellows seal.

Moreover, various modifications are contemplated which retain the basic concept of sealing the objective 60 to an objective tube 40 by sealing the outer perimeter of the outermost lens 64 of the objective 60 while allowing that outermost lens 64 to be exposed to the vacuum.

Figure 5:
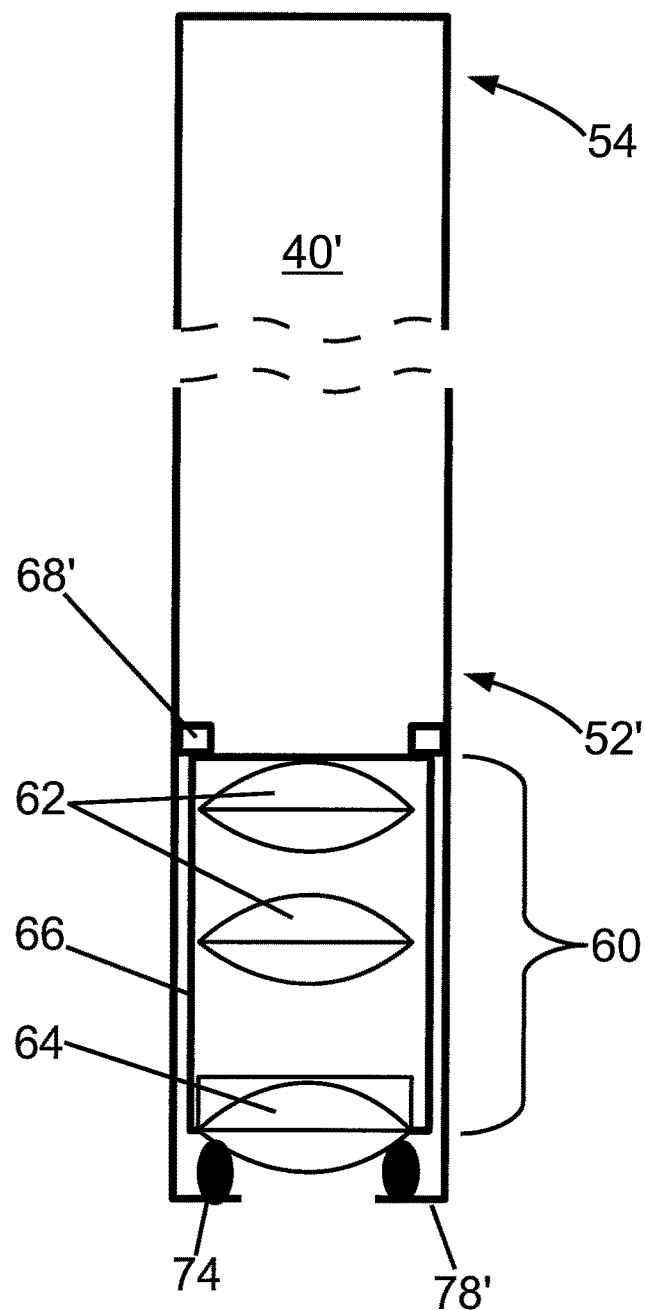
FIG. 5 diagrammatically illustrates an alternative embodiment of the objective end of the objective tube of the in-situ microscope of FIGS. 1 and 2 which omits the objective sleeve.

With reference to FIG. 5, by way of another illustrative example, the objective 60 may be sealed to a modified objective tube 40' without the use of the objective sleeve 70. Rather, in the embodiment of FIG. 5 the modified objective tube 40' includes a modified objective end 52' with an integral rim or lip 78' replacing the rim or lip 78 of the objective sleeve 70. This design thereby eliminates the objective sleeve 70 and the upper o-ring 72. In this design the objective 60 cannot be loaded into the objective end 52' because the integral rim or lip 78' prevents loading from this end. Rather, in this design all components are loaded via the camera end of the objective tube 40' in the following order: (1) first, the o-ring 74 is loaded, and pushed down the objective tube 40' until it rests against the integral rim or lip 78'; next the objective 60 is loaded until its outermost lens 64 rests against the o-ring 74; next, a locking ring 68' is loaded and secured against the end of the objective 60 opposite from the lens 64 to press the objective 60 (and more particularly its outermost lens 64) against the o-ring 74 to form the seal. In a suitable approach, the locking ring 68' has a threaded outer diameter that engages threading on the inner diameter of the objective tube 40' to screw down onto the objective 60; alternatively, the locking ring 68' can employ a friction fit, or be welded into place, or so forth. Note that the locking ring 68' functions to press the objective 60 against the o-ring 74, but the locking ring 68' does not itself provide a vacuum sealing function.

With returning reference particularly to FIG. 1, the separation between the objective 60 and the sample 12 (i.e., the objective-to-specimen separation) is controlled by the length of the objective tube 40 (or, more particularly, by the length of the portion of the objective tube 40 extending from the mounting flange 32 into the vacuum) and this separation can be made arbitrarily small by suitable selection of this length. Moreover, in the illustrative embodiment the objective-to-specimen separation can be adjusted for differently-sized samples or specific applications by adjusting the position of the tube clamp 44 on the standoffs 46 and, in some embodiments, by sliding the objective tube 40 in and out of the o-rings of the flange base. Still further, in the illustrative embodiment the tilt adjustment provided by the tilt adjustment screws 48 enable limited tilting of the in-situ microscope respective to the sample 12. These adjustments are achievable while maintaining the vacuum boundary 80.

With particular reference to FIGS. 1 and 2, the illumination/imaging unit 62 is disposed at the camera end 54 of the objective tube 40, and provides for input of illumination through the hollow objective tube 40 to the objective 60 as well as for coupling light received from the objective 60 via the hollow objective tube 40 to imaging components such as an eyepiece (i.e. ocular lens, not shown), or an illustrative digital imaging unit (e.g. digital camera, CCD array, or so forth) 90 and associated lensing 92 (diagrammatically indicated in FIGS. 1 and 2 by a single lens, but more generally may include multiple lenses/compound lenses/achromatic or apochromatic lenses, or so forth). The lensing 92 may provide magnification (in addition to that provided by the objective 60). The illustrative illumination/imaging unit 62 includes a beam splitter 94 that admits illumination light from an illumination aperture 96 which may comprise a fiber optical coupling, collection optics coupled with an illumination lamp, a permanently affixed semiconductor LED illuminator, or so forth. In general, the illumination may be either coherent light (e.g., output by a laser) or incoherent light (e.g. output by an LED, halogen lamp, tungsten lamp, HID lamp, or so forth).

It will be appreciated that the illustrative illumination/imaging unit 62 is merely an example, and that the disclosed in-situ optical column, e.g. the mounting flange 32, objective tube 40, 40', objective 60, and associated adjustment mounting and vacuum sealing features, may be used in conjunction with various illumination, imaging, or light injection or coupling applications. In some embodiments, all lenses of the objective 60 and illumination/imaging unit 62 are achromatic lenses, or even more preferably apochromatic lenses, in order to achieve wideband imaging.

In the embodiments of FIGS. 3 and 5, the objective end of the objective tube of the in-situ microscope is designed to allow the outermost lens 64 to be exposed to the vacuum by forming a vacuum-tight seal at the periphery of the outermost lens 64. In these designs, the outermost lens 64 is part of the vacuum boundary 80 as indicated in FIG. 1.

Figure 6:
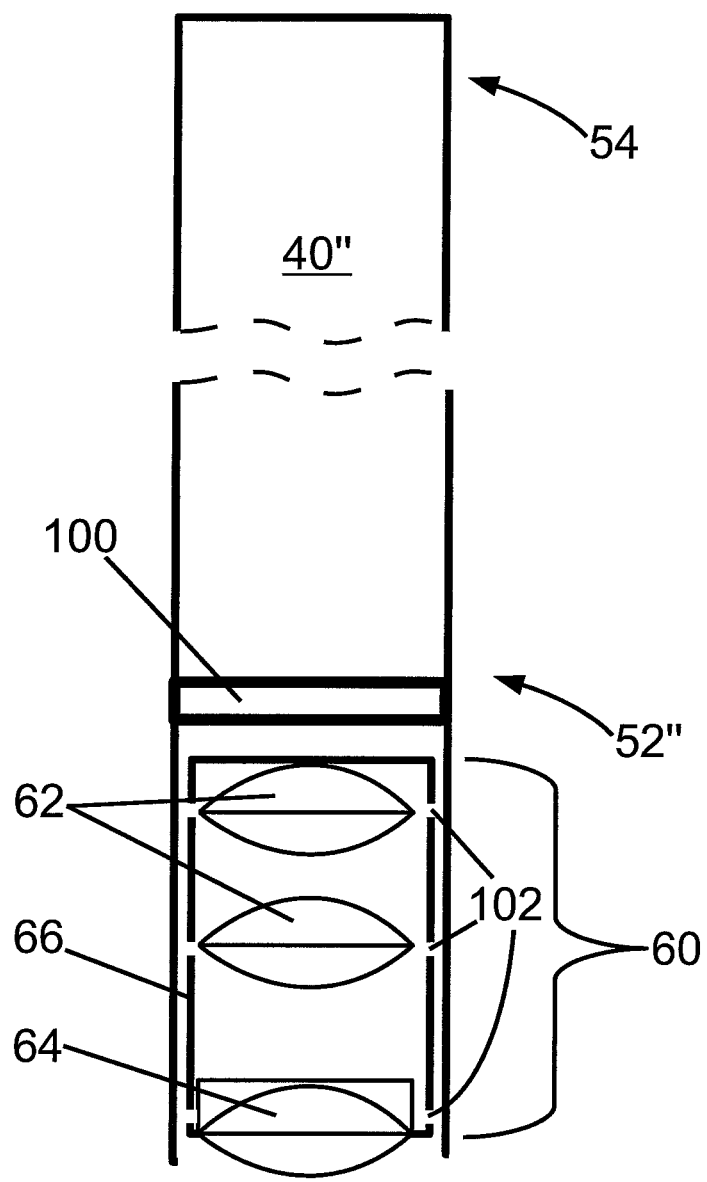
FIG. 6 diagrammatically illustrates an alternative embodiment of the objective end of the objective tube of the in-situ microscope of FIGS. 1 and 2 in which the vacuum-tight seal is made "behind" the microscope objective rather than at the outermost lens.

With reference to FIG. 6, in another approach an objective end 52" has a vacuum-tight seal formed at a backside of the objective tube 40". More particularly, a vacuum-tight sealing glass, quartz, or other transparent window 100 is located "behind" the objective, that is in the conjugate area, on the side of the microscope objective 60 opposite from the outermost lens 64. The periphery of the window 100 may be sealed to the inside surface of the objective tube 40" by o-rings, sealing epoxy or so forth. In this case the objective tube 40" can be modified by having no lowermost rim or lip, and no separate objective sleeve is needed. The microscope objective 60 may be secured inside the lower end of the objective tube 40" by any suitable approach (e.g. epoxy, friction-fit), but does not need to have a vacuum-tight seal since in the embodiment of FIG. 6 the transparent window 100 forms the vacuum boundary. Indeed, in this embodiment since the entire microscope objective 60 is exposed to the vacuum, it is advantageous to ensure effective fluid flow to the interior of the microscope objective 60 in order to ensure efficient outgassing—otherwise slow outgassing from the microscope objective could act as a virtual leak for an extended period of time after pump-down of the vacuum chamber 10. To provide more efficient outgassing, holes 102 are optionally drilled in the objective tubular housing 66. In the embodiment of FIG. 6, the microscope objective 60 is preferably an infinite conjugate objective (also known as infinity-corrected objective), for which the window 100 placed in the conjugate area has no appreciable effect on optical performance. However, the approach of FIG. 6 can also be used with a finite conjugate microscope objective.

The imaging may, for example, be used for simultaneous FIB milling and imaging for visual end point detection. Some non-limiting FIB workstation applications of the in-situ optical microscope 30 include: (1) non-destructive, non-charging surface and subsurface imaging for guide and location navigation for front and backside microcircuit edit in a FIB workstation; (2) backside microcircuit imaging for a FIB workstation to provide location guidance via through silicon imaging at NIR light wavelengths, e.g. greater than or equal to 900 nm in some embodiments (Silicon is transparent to NIR light, SEM & FIB beams are not and only penetrate a few microns maximum; whereas, NIR light can penetrate over a hundred urn of silicon optically and non-destructively); (3) optical interference microscopy or profiliometry (e.g. Linnik interferometer) for FIB workstation for pre-endpoint detection or depth estimation; (4) enhanced optical resolution of In FIB microscopy enabled by in-situ near ultraviolet microscope imaging; (5) optically induced NIR phase shift interferometry for accurate depth of ablation measurement in-situ for a FIB workstation; or so forth. In addition to (or instead of) imaging, the in-situ optical column may be used for active optical processing of the sample 12, for example charge neutralization with ultraviolet light, optical semiconductor passivation, or so forth.

The inside surface of the objective tube 40, 40' may be configured for a given application. For imaging applications, the surface may be coated with a highly light-absorbing coating to suppress stray light reflections that could create image artifacts. Additionally or alternatively, optical baffles can be employed to reduce reflection. On the other hand, for active applications that seek to maximize light throughput, a highly reflective inner coating is contemplated.

The outermost lens 64 of the objective 60 is exposed to the vacuum. For applications such as sputtering or layer deposition, this can lead to contamination collecting on the outermost objective lens 64, which over time can degrade imaging or other optical tasks performed using the optical column. If the vacuum chamber 10 is vented to atmospheric pressure on a sufficiently frequent basis (e.g. for sample loading/unloading) then this lens 64 can be cleaned as part of routine vacuum chamber maintenance operations. In another (or supplemental) approach, a heater may be installed to outgas the objective 60. For example, the objective tube 40, 40' can be wrapped with a heater tape. (In the embodiment of FIG. 6, such heater tape may also operate in addition to or in place of the holes 102 to promote outgassing of the microscope objective 60).

The preferred embodiments have been illustrated and described. Obviously, modifications and alterations will occur to others upon reading and understanding the preceding detailed description. It is intended that the invention be construed as including all such modifications and alterations insofar as they come within the scope of the appended claims or the equivalents thereof.

The invention claimed is:

1. An in-situ optical column comprising:
   a hollow objective tube;
   a microscope objective including an outermost lens, the microscope objective inserted at least partway into an objective end of the hollow objective tube with the outermost lens exposed; and a vacuum-tight seal spanning the inside of the hollow objective tube.

2. The in-situ optical column of claim 1 further comprising:

an annular rim or lip extending inward over a periphery of the exposed outermost lens of the microscope objective; and an annular gasket sealing between and contacting the periphery of the outermost lens of the microscope objective and the annular rim or lip;

wherein the vacuum-tight seal is defined by the annular rim or lip, the annular gasket, and the outermost lens of the microscope objective.

3. The in-situ optical column of claim 2 further comprising:

an objective sleeve disposed over and sealed with an outside of the objective end of the hollow objective tube, the annular rim or lip integral with or connected with the objective sleeve and extending inward;

wherein the vacuum-tight seal is further defined by the objective sleeve.

4. The in-situ optical column of claim 1 further comprising:

an annular rim or lip having a vacuum-tight seal with the objective end of the hollow objective tube and extending inward; and an annular gasket sealing between and contacting a periphery of the outermost lens of the microscope objective and the annular rim or lip;

wherein the vacuum-tight seal is defined by the annular rim or lip, the annular gasket, and the outermost lens of the microscope objective.

5. The in-situ optical column of claim 4 further comprising:

an objective sleeve disposed over and sealed with an outside of the objective end of the hollow objective tube, the annular rim or lip integral with or connected with the objective sleeve and extending inward;

wherein the vacuum-tight seal is further defined by the objective sleeve.

6. The in-situ optical column of claim 5 further including an annular sleeve gasket sealing a gap between the objective sleeve and the outside of the objective end of the hollow objective tube wherein the vacuum-tight seal is further defined by the annular sleeve gasket.

7. The in-situ optical column of claim 4 wherein the annular rim or lip is integral with or connected with the objective tube and extends inward.

8. The in-situ optical column of claim 1 wherein the vacuum-tight seal spanning the inside of the hollow objective tube comprises:

a transparent window disposed on the side of the microscope objective opposite from the outermost lens, the periphery of the transparent window being sealed to the inside surface of the hollow objective tube.

9. The in-situ optical column of claim 8 wherein the microscope objective has outgassing holes formed into a housing of the microscope objective.

10. The in-situ optical column of claim 1 wherein the microscope objective includes the outermost lens and at least one additional lens housed in a tubular objective housing that is separate from the hollow objective tube, and the tubular objective housing is arranged coaxially with and at least partially inside the objective end of the hollow objective tube.

11. The in-situ optical column of claim 1 wherein the microscope objective is not a vacuum-tight assembly.

12. The in-situ optical column of claim 1 wherein the outermost lens of the microscope objective is an achromatic lens or an apochromatic lens.

13. The in-situ optical column of claim 1 wherein the microscope objective has a magnification of at least 10×.

14. The in-situ optical column of claim 1 further comprising:

a mounting flange configured to connect with a flange of a vacuum feedthrough, the mounting flange having a sealed central through-hole passing the objective tube; and a tube clamp secured with the mounting flange and clamped to the objective tube.

15. The in-situ optical column of claim 14 wherein the tube clamp includes a translational adjustment for adjusting position of the clamped objective tube along the direction of a tube axis of the objective tube.

16. The in-situ optical column of claim 14 wherein the tube clamp includes a tilt adjustment for adjusting a tilt of the objective tube.

17. The in-situ optical column of claim 1 further comprising:

an ocular lens or digital imaging unit disposed at a camera end of the hollow objective tube opposite from the objective end of the hollow objective tube.

18. A vacuum system comprising:

a vacuum chamber having a vacuum feedthrough with a flange;

a sample stage; and an in-situ optical column with a mounting flange via which the in-situ optical column is mounted to the flange of the vacuum feedthrough with the microscope objective arranged to image a sample disposed on the sample stage, the in-situ optical column including a hollow objective tube, a microscope objective inserted at least partway into an objective end of the hollow objective tube with an outermost lens exposed to vacuum of the vacuum chamber, and a vacuum-tight seal spanning the inside of the hollow objective tube.

19. The vacuum system of claim 18 wherein the vacuum system is a focused ion beam (FIB) workstation further comprising at least one focused ion beam tool arranged to apply a focused ion beam to a sample disposed on the sample stage.

20. The vacuum system of claim 18 wherein the vacuum system has a base pressure of $5\times10^{-6}$ mbar or lower.

* * * * *